INVENTORS
GAROLD K. JENSEN
JAMES E. MC GEOGH

BY

Howard White

ATTORNEYS

Jan. 13, 1959

G. K. JENSEN ET AL 2,868,973

DECADE FREQUENCY GENERATOR

Filed June 17, 1953

3 Sheets-Sheet 2

INVENTORS
GAROLD K. JENSEN
JAMES E. MC GEOGH

BY

Howard White

ATTORNEYS

INVENTORS
GAROLD K. JENSEN
JAMES E. MC GEOGH
BY
Howard White
ATTORNEYS

United States Patent Office 2,868,973

Patented Jan. 13, 1959

2,868,973

DECADE FREQUENCY GENERATOR

Garold K. Jensen, Pinecrest, Va., and James E. McGeogh, Silver Spring, Md., assignors to the United States of America as represented by the Secretary of the Navy Application June 17, 1953, Serial No. 362,428

5 Claims. (Cl. 250—36)

(Granted under Title 35, U. S. Code (1952), sec. 266)

This invention relates generally to frequency generators and more specifically to decade type variable frequency generators.

Normally when a frequency is synthesized by adding numerous known frequencies in successive stages an effort is made to maintain the desired frequencies pure and undistorted by very elaborate filtering. This filtering is usually performed with each component frequency and each successive frequency since the possible sidebands will be found as close to the synthesized frequency as the magnitude of the smallest component frequency. Thus if the unwanted components were not filtered before synthesizing, the sidebands would be too close to the desired frequency for effective filtering with the filters now available in the art.

By the use of a filter at the final output which is both very narrow band-pass and automatically variable in center frequency it is possible to synthesize the desired frequency heedless of distortion and sidebands and then separate the sine wave of the desired frequency from the distorted wave form. The resulting frequency generator is much more simple, compact, less expensive, and more accurate than the frequency generators available today.

One object of the present invention is therefore to provide an improved frequency generator.

Another object of this invention is to provide a direct reading, variable, decade frequency generator which requires a minimum number of tuned circuits and filters.

Another object of this invention is to provide a direct reading variable source of frequency of quartz crystal accuracy using only one quartz crystal source of frequency.

Another object of this invention is to provide a decade frequency generator variable from zero to one megacycle in one cycle steps with extreme accuracy.

Another object of this invention is to provide a frequency generator which makes use of a very narrow band-pass filter of automatically varying center frequency to eliminate all distortion and sidebands from the synthesized frequency.

Another object of this invention is to provide a frequency generator which produces an undistorted sine wave frequency by virtue of an oscillator isolated from the sidebands of a complex synthesized frequency but locked to the predominant component of the synthesized frequency.

Other objects and advantages of the present invention will become apparent upon a careful consideration of the following detailed description when taken in conjunction with the accompanying drawings, in which.

In the figures, similar reference characters have been used to designate corresponding elements of the invention.

Figure 1:
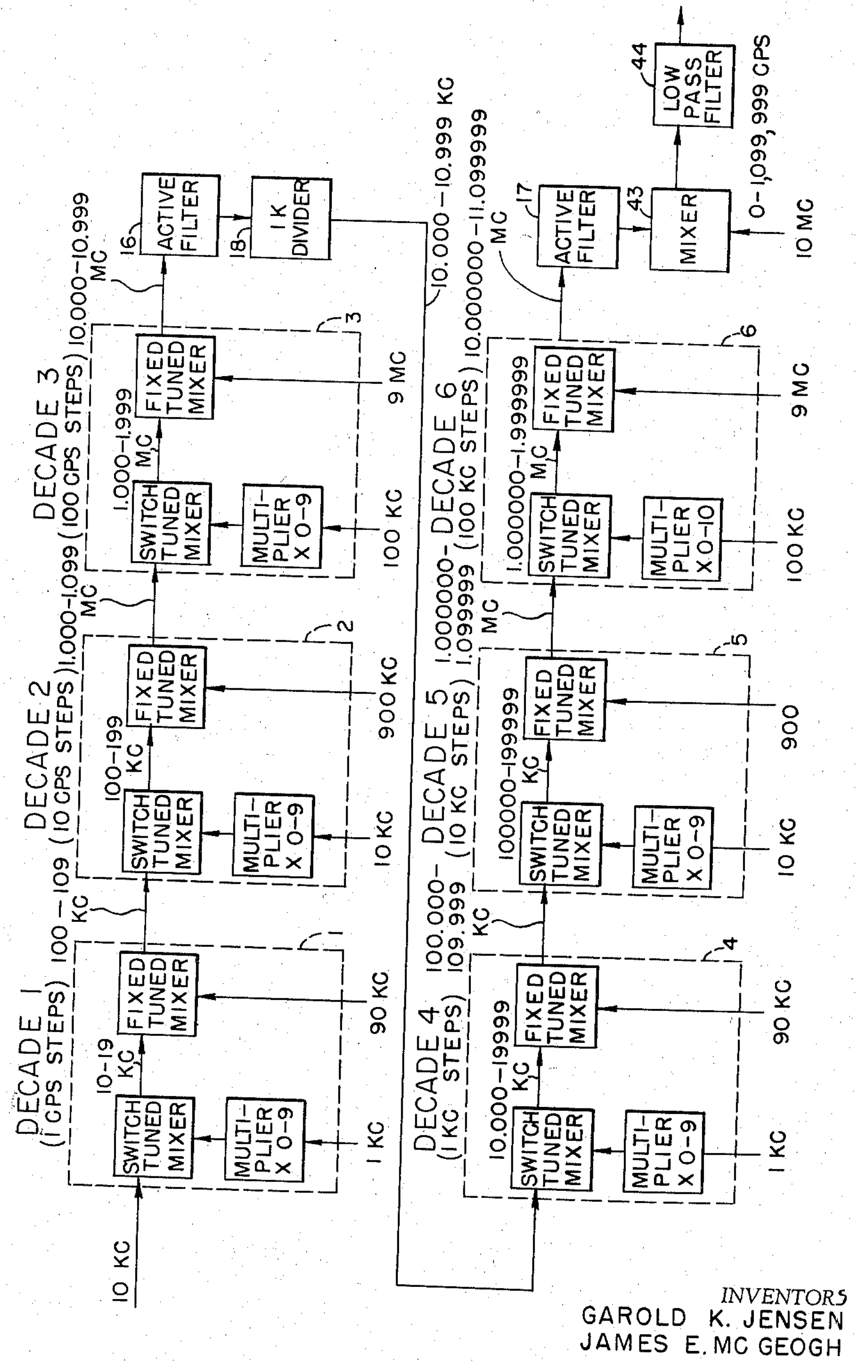
Figure 1 is a block diagram of the decade frequency generator showing the frequencies at each step of synthesizing.

Referring to the block diagram of Figure 1, the elements of the invention, less the fixed frequency source, are shown in their functional arrangement. The dashed boxes 1, 2, 3, 4, 5 and 6 represent the units, tens, hundreds, thousands, ten thousands and hundred thousands decades respectively. Each can be varied through at least ten decimal positions independently of the others.

Figures 2, 3, 4:
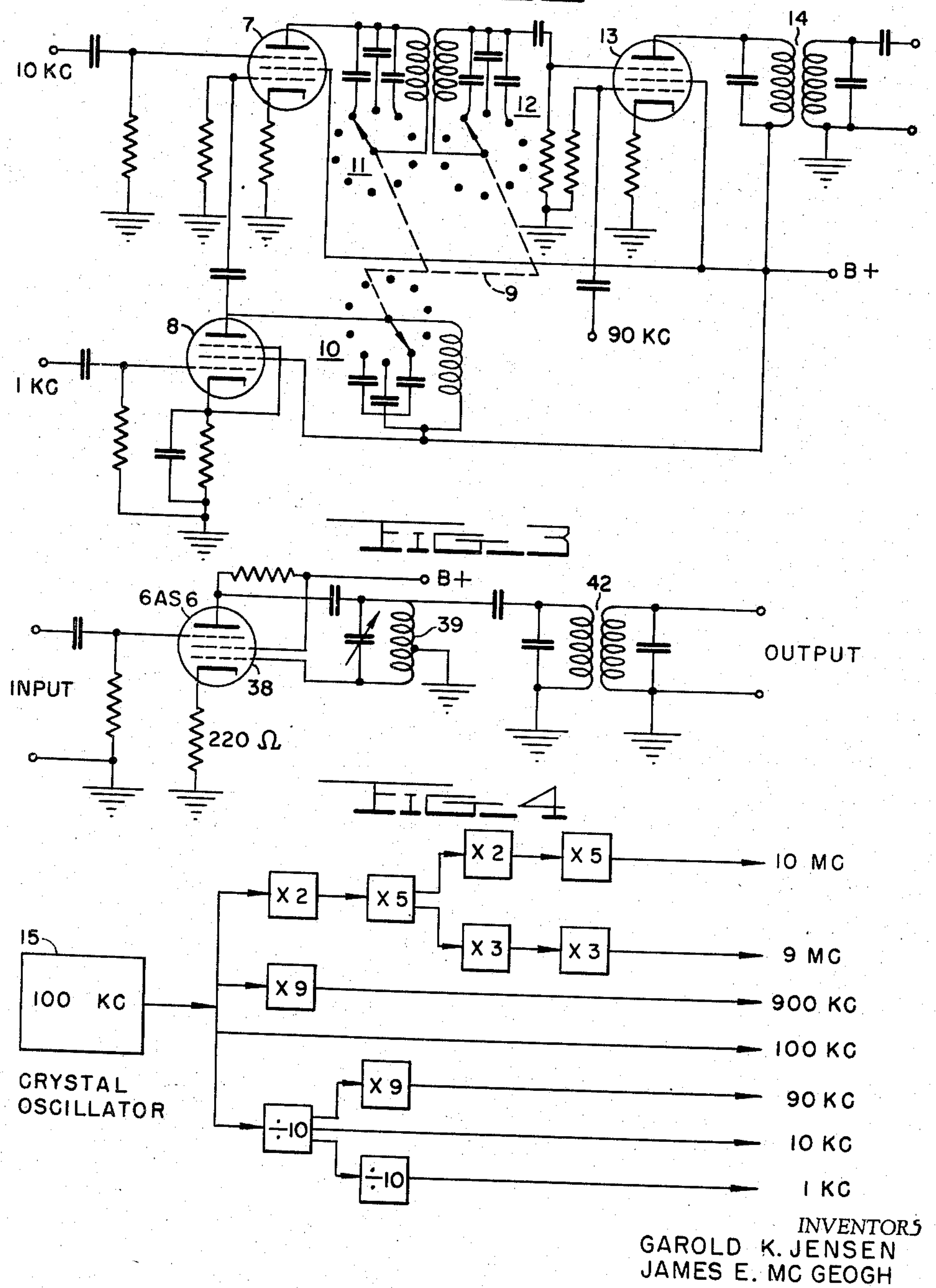
Figure 2 is a circuit diagram of a representative decade step.
Figure 3 is a circuit diagram of one stage of the one K divider which is used between decades 3 and 4.
Figure 4 is a block diagram showing the steps in creating the fixed frequencies necessary from a 100 kc. source.

Figure 4 shows the method of obtaining all the fixed frequencies used in synthesizing the desired frequency. The quartz crystal oscillator 15 produces a 100 kc. frequency which is multiplied or divided in stages as shown in Figure 4 by conventional tuned circuits to obtain the necessary frequencies from 1 kc. to 10 mc. The frequency multipliers and dividers are labelled according to the number of times they multiply or divide, the multiplying function being indicated by × and the divide by ÷.

The six decades are divided into two stages which are substantially identical so as to perform the synthesizing of the frequencies in a frequency range within which the circuit elements are of reasonable size. Thus referring to Figure 1, it is evident that the lowest frequencies mixed are one and ten kc. in decade 1. These one kc. steps in decade 1, because of the one K divider 18 between stages, result in one C. P. S. steps in the output frequency.

To perform the coarse filtering required in each decade, a higher frequency is mixed with the variable frequency produced in that decade to make the possible variation range less than 10% of the total frequency fed to the succeeding decade. Taking decade 1 as an example, the fixed 90 kc. frequency is mixed with the variable 10 to 19 kc. frequency to produce a varying less than 10% i. e. a band-width of 9 kc. at 104.5 kc. Hence the coupling between decades 1 and 2 is tuned to pass that 10% range of frequencies.

Figure 2 shows the circuit included in each decade, the frequency inputs shown being for decade 1. Tube 7, a pentode mixer, receives on one grid the fixed 10 kc. frequency and on another grid the variable frequency from 0 to 9 in one kc. steps from the output of multiplier tube 8. The 3-gang switch 9 selects one condenser 10 to tune the plate circuit of tube 8 to the desired resonant frequency; the tuning to any step frequency from 0 to 9 kc. represents the unit digit of the value of the output frequency of the generator. The switched tuned condensers 10, 11 and 12 have ten positions with a separate condenser for each position; the schematic showing in the drawing discloses only three of those positions. It is also clear that the tuning of the multiplier circuit also tunes the mixer circuit to the step frequencies from 10 to 19 kc. by virtue of condensers 10, 11 and 12 being ganged. The fixed tuned mixer is made up of pentode mixer 13 and fixed double tuned coupling transformer 14. Each additional decade is substantially identical to the one described except for a difference in frequencies fed in and the circuit values of the circuits at those frequencies.

Figure 5:
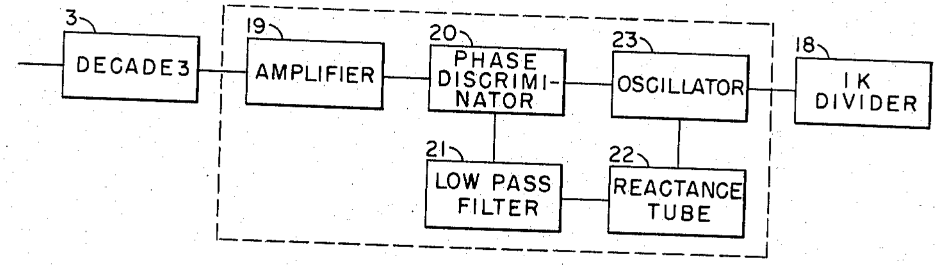
Figure 5 is a block diagram showing the relationship between the various elements of the narrow band-pass filter.
Figures 6, 7:
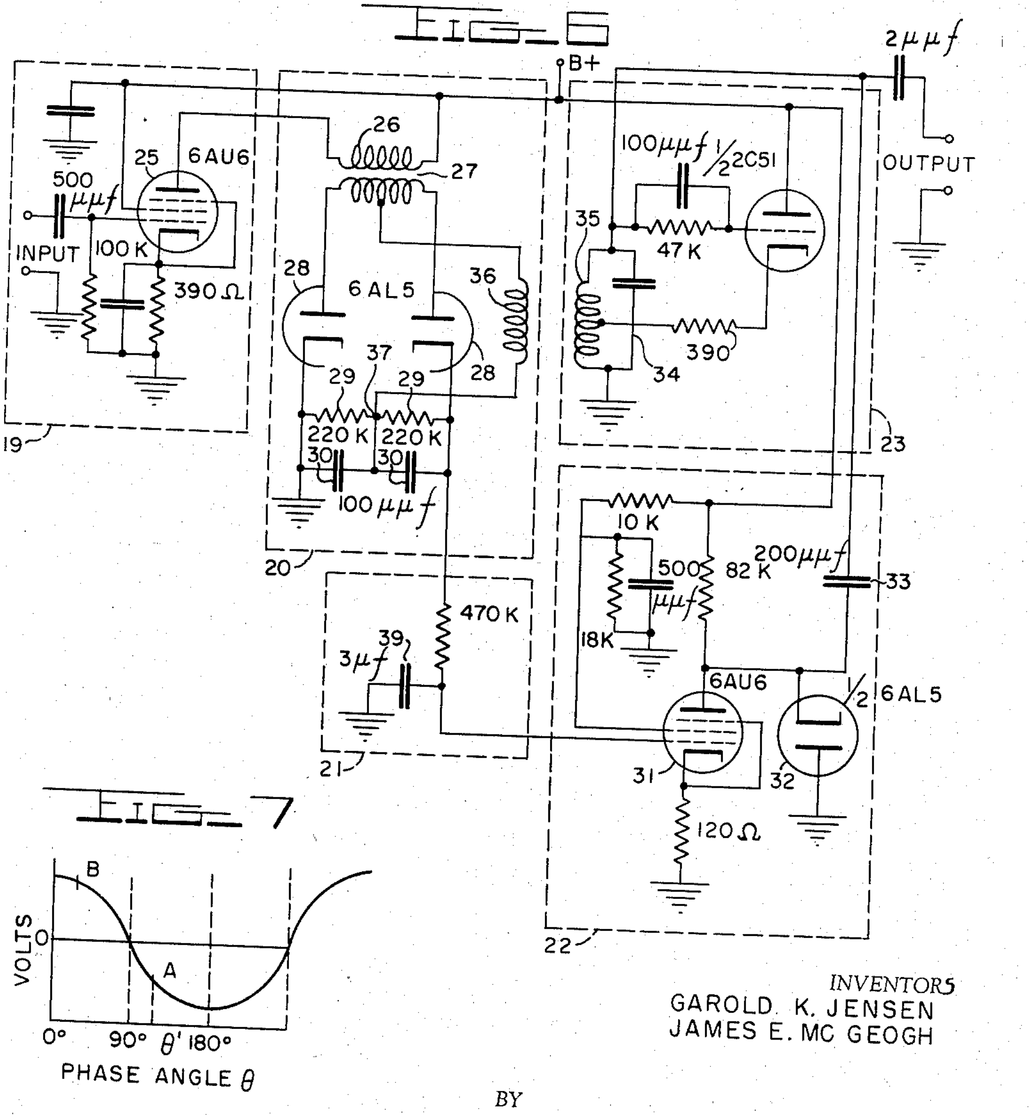
Figure 6 is a circuit diagram of a preferred embodiment of the narrow band-pass filter.
Figure 7 is a characteristic curve of the phase discriminator of the narrow band-pass filter.

Referring again to Figure 1, decades 3 and 6, the last decade in each stage, are followed by "active filters" 16 and 17 which are identical to each other in structure and function. The filters 16 and 17 have been designated "active filters" because their band-pass frequency range will automatically center itself on a predominant input frequency. Figures 5 and 6 show the details of one of the filters, the purpose of which is to reduce to a negligible value all distortion and sidebands from the selected frequency synthesized in the preceding stage.

In the block diagram of Figure 5, active filters 16 is is shown being fed by decade 3 and the filter output is supplied to frequency divider 18. Amplifier 19 receives from decade 3 the distorted frequency which is made up of the selected frequency and harmonics and sidebands of lesser amplitude than the selected frequency. Amplifier 19 is inductively coupled to phase discriminator 20. The output of phase discriminator 20, after passing through the low pass filter 21 biases the reactance tube 22 which in turn varies the frequency of oscillator 23 to correspond with the predominant frequency supplied to the phase discriminator. Divider 18 is fed by the oscillator which supplies it with an undistorted sine wave signal of a frequency equal to the predominant or selected frequency of the decade 3.

Referring to Figure 6, a preferred embodiment of the filter is shown schematically incorporating selected subcombination circuits and circuit values. Amplifier 19 is shown as a conventional pentode amplifier stage using tube 25 which may be a 6AU6. There is a broad band inductive coupling between the amplifier 19 and phase discriminator 20 through coils 26 and 27. This coupling permits use through the 10% range of frequencies required. The extremities of coil 27 are connected to the plates of twin diode 28 which may be a 6AL5. A pair of shunt capacitance filters made up of resistances 29 and condensers 30 are serially connected between the cathodes of tube 28.

One of the cathodes of tube 28 is grounded and the other is connected through low pass filter 21 to the control grid of reactance tube 31 which may be a 6AU6. Reactance tube 31 is operated below the knee of the pentode plate characteristic curve. Diode clamp 32 is connected between the plate of tube 31 and ground to prevent the plate from swinging negative.

Coupling condenser 33 connects the plate of reactance tube 31 to the tank circuit 34 of the oscillator 23. The oscillator is of any conventional type and may employ ½ of a 2C51 tube. The coil 35 of the tank circuit 34 is coupled to the phase discriminator through coil 36. The extremities of coil 36 are connected to the midpoint of coil 27 and to terminal 37 where the two serially connected shunt capacitance filters are joined. The tank circuit 34 of the oscillator is also connected through a coupling condenser to the filter output terminals.

In considering the operation of the filter, the effect of the predominant frequency alone will be analyzed first and then the possible interference of the sidebands will be discussed. Under the conditions of zero bias on the control grid of reactance tube 31, the oscillator 23 will oscillate at the middle of its frequency range. As a result two different frequencies will initially be fed into the phase discriminator, the predominant frequency of decade 3 and the oscillator frequency, unless of course, the output of decade 3 equals the mid range oscillator frequency. The output of the discriminator 20 will be a beat frequency representing the difference between the two frequencies. The alternating signal will be substantially attenuated in passing through the low pass filter 21, but it may be very small because of the cumulative effect of this signal as to cause the frequency of the oscillator to lock on the predominant frequency.

The reactance tube 31 and condenser 33 are in effect in parallel with the tank circuit 34 of oscillator 23. Consequently any change in the bias on tube 31 changes the total impedance of that parallel branch and varies the effect of the capacitive reactance on the tank circuit. Hence an increase in grid bias in tube 31 increases the capacitive effect of condenser 33 on the tank circuit and reduces the frequency of oscillation of oscillator 23.

It can be easily seen that an alternating signal on the grid of tube 31 would frequency modulate the oscillator 23. During each cycle of modulation, only one-half of the cycle would tend to direct the oscillator more toward the predominant frequency. When the oscillator was so directed, the beat frequency output of the discriminator for that portion of the cycle would be reduced. This effect would tend to increase the duration of either the positive or negative portion of the alternating input to the low pass filter. Accordingly this increase of one portion relative to the other would tend to produce a static positive or negative charge on condenser 39 of the low pass filter. This charge would be cumulative tending to bias the grid of tube 31 more toward the ultimate D. C. bias necessary to lock the oscillator frequency with the predominant frequency.

Figure 7 shows the characteristic curve of the phase discriminator for conditions existing after frequency lock between the oscillator and the predominant frequency. The phase discriminator output is plotted against phase relation between the two input frequencies. Thus the discriminator will supply some D. C. voltage to the reactance tube dependent on the phase difference between the two frequencies. If the predominant frequency is higher than the midband frequency for which the oscillator is designed, a negative bias will be required by the reactance tube 31 to lock the frequencies. It was explained above how the cumulative charging of condenser 39 would produce this negative bias which may be shown by point A on the curve of Figure 7. When the negative bias is reached, the frequencies will be equal but out of phase by $\theta'$ as shown in Figure 7 and hence they will produce no beat frequency but only the negative bias.

Once the locked frequency condition has been achieved the sideband frequencies are sufficiently attenuated by the low pass filter 21 that they have a negligible effect on the reactance tube and the oscillator. Because of the high attenuation of the sidebands, they represent a very small alternating signal compared to the relatively large D. C. bias. As a result the largest effect which could be produced would be a slight oscillation of the operating point A along the characteristic curve. Thus the output of the filter will be free of sidebands and distortion and will be precisely locked to the predominant frequency synthesized in the preceding decades.

The one K divider 18 receives the undistorted output of filter 16 and in a series of six stages, identical to the one shown in Figure 3, produces a frequency 1/1000th of the input. The six successive stages involve divisions by two, five, two, five, two and five respectively. Each division is accomplished by means of an oscillator locked to the desired submultiple of the input frequency. The low Q plate circuit of the oscillator of Figure 3 permits a 10% range of control frequencies while still maintaining the lock between the input and the divided output frequency. Dividing means of this type are well known in the art and hence no detailed explanation need be given. An article entiled "The Inductance Capacitance Oscillator as a Frequency Divider" appearing in the proceedings of the I. R. E., October 1946, explains the advantages and limitations of this type of divider as well as the considerations in selecting the circuit values. The signal from coil 39 will contain some distortion which may be reduced by the double tuned transformer 42 if necessary.

As can be seen from Figure 1, the output of the divider 18 passes through decades 4, 5 and 6 and the additional active filter 17 to remove the sidebands introduced in the preceding three decades. The frequency is then variable through more than one megacycle as desired but has the 10 megacycle sum added to it to facilitate filtering in a 10% range. To obtain the desired frequency range, 0 to 1 megacycle, a conventional mixer 43 is supplied with a 10-megacycle signal, developed as shown in Figure 4, and the variable frequency. The difference frequency received through low pass filer 44 is then undistorted, free of sidebands and variable from 0 to1,099,999 C. P. S.

It is obvious that additional stages could be added to increase the range to higher frequencies or to reproduce frequencies more accurately by adding tenths, hundredths, and thousandths decimal digits if desired. It is also contemplated that the specific mixers and distorting means used in each decade could be replaced by equivalent circuits employing crystal diodes instead of vacuum tubes. Thus by using a crystal diode mixing circuit and distorting circuit, the number of tubes in each decade could be reduced by two-thirds.

The frequency source disclosed herein is not only extremely accurate but is more compact and less expensive than any heretofore known in the art. The entire apparatus occupies a space less than one cubic foot in volume and hence is very adaptable to portable use in the field. The elimination of many precision tuned circuits by the use of the "active filter" materially reduces the cost. The production of any desired frequency with quartz crystal accuracy from 1 C. P. S. to 1 megacycle using only one quartz crystal is of great importance considering the number of quartz crystals formerly required in communication where a number of accurate frequencies were to be produced. It is also evident that the use of a single reference crystal increases the accuracy since there are no possibilities of beat frequencies developing because of variations in several reference crystals.

Although certain specific embodiments of this invention have been disclosed and described it is to be understood that they are merely illustrative of this invention and modifications may, of course, be made without departing from the spirit and scope of the invention as confined in the appended claims.

The invention described herein may be manufactured and used by or for the Government of the United States of America for governmental purposes without the paymen of any royalties thereon or therefor.

What is claimed is:

1. In a frequency generator, a signal generator for providing a standard signal, means connected to said signal generator and responsive to said standard signal for providing a group of signals, a plurality of mixers connected in cascade, means for applying a first and second signal of said group of signals to the first of said plurality of mixers, means for applying each signal of the remaining group of signals to a respective one of the remaining plurality of mixers, a phase discriminator for providing a direct current signal, a frequency oscillator, means for connecting the output of the last of said plurality of mixers to the phase discriminator, means for coupling the output of said frequency oscillator to said phase discriminator, means connected between the output of said phase discriminator and said frequency oscillator for substantially eliminating alternating current signals in the output of the phase discriminator and for controlling the frequency of said frequency oscillator in dependency on the magnitude of said direct current signal, an output circuit, and means for connecting said output circuit to the frequency oscillator.

2. In a frequency generator, a signal generator for providing a standard signal, means connected to said signal generator and responsive to said standard signal for providing a group of signals, a plurality of mixers connected in cascade, means for applying a first and second signal of said group of signals to the first of said plurality of mixers, means for applying each signal of the remaining group of signals to a respective one of the remaining plurality of mixers, a phase discriminator for providing a direct current signal, a frequency oscillator including a frequency determinative circuit, means for connecting the output of the last of said plurality of mixers to the phase discriminator, means for coupling the output of said frequency oscillator to said phase discriminator, a control circuit including an electron tube having at least an anode, a cathode and a control element for controlling the frequency of said frequency oscillator in dependency on the magnitude of said direct current signal, means connected between the control element of said electron tube and the output of said phase discriminator for substantially eliminating alternating current signals in the output of the phase discriminator and for maintaining said control element at a potential level in dependency on said direct current signal, means for connecting said electron tube across said frequency determinative circuit, an output circuit, and means for connecting said output circuit to the frequency oscillator.

3. In a frequency generator, a signal generator for providing a standard signal, means connected to said signal generator and responsive to said standard signal for providing a group of first signals and a group of second signals, each first signal and second signal having a predetermined frequency, a plurality of decade units each including a switch tuned mixer connected in cascade with a fixed tuned mixer, means for connecting said plurality of decade units to form a series of decade units such that the switch tuned mixer of each successive decade unit is connected in cascade with the fixed tuned mixer of the preceding decade unit, means for applying each first signal to a respective one of said switch tuned mixers, means for applying each second signal to a respective one of said fixed tuned mixers, a phase discriminator for providing a direct current signal, means for connecting the output of the last of said series of decade units to the phase discriminator, means connected to the switch tuned mixer of the first of said series of decade units for applying an intelligence signal having a selected frequency to the switch tuned mixer, said selected frequency having a value equal to the sum of a fixed value and a variable value, a frequency oscillator, means for coupling the output of said frequency oscillator to the phase discriminator, means connected between the output of said phase discriminator and said frequency oscillator for substantially eliminating alternating current signals in the output of the phase discriminator and for controlling the frequency of said frequency oscillator in dependency on the magnitude of said direct current signal, a mixer, means for connecting said mixer to the output of said frequency oscillator, means connected to said mixer for applying a signal to the mixer having a frequency equal to the sum of the fixed value of the selected frequency of said intelligence signal and the values of the frequencies of the second signals, a second output circuit, and means for connecting said second output circuit to the mixer.

4. In a frequency generator, a signal generator for providing a standard signal, means connected to said signal generator and responsive to said standard signal for providing a group of first signals and a group of second signals, each first signal and second signal having a predetermined frequency, a plurality of decade units each including a switch tuned mixer connected in cascade with a fixed tuned mixer, means for connecting said plurality of decade units to form a series of decade units such that the switch tuned mixer of each successive decade unit is connected in cascade with the fixed tuned mixer of the preceding decade unit, means for applying each first signal to a respective one of said switch tuned mixers, means for applying each second signal to a respective one of said fixed tuned mixers, a phase discriminator for providing a direct current signal, means for connecting the output of the last of said series of decade units to the phase discriminator, means connected to the switch tuned mixer of the first of said series of decade units for applying an intelligance signal having a selected frequency to the switch tuned mixer, said selected frequency having a value equal to the sum of a fixed value and a variable value, a frequency oscillator including a frequency determinative circuit, means for coupling the output of said frequency oscillator to said phase discriminator, means including an electron tube having at least an anode, a cathode, and a control element for controlling the frequency of said frequency oscillator in dependency on the magnitude of said direct current signal, means connected between the control element of said electron tube and the output of said phase discriminator for substantially eliminating alternating current signals in the output of the phase discriminator and for applying said direct current signal to said control element, means for connecting said electron tube across said frequency determinative circuit, a mixer, means for connecting said mixer to the output of said frequency oscillator, means connected to said mixer for applying a signal to the mixer having a frequency equal to the sum of the values of the frequencies of the second signals and the fixed value of the selected frequency of said intelligence signal, a second output circuit, and means for connecting said second output circuit to the mixer.

5. In a frequency generator, a signal generator for providing a standard signal, means connected to said signal generator and responsive to said standard signal for providing first signals and second signals, a first plurality of mixers connected in cascade, means for applying a pair of said first signals to the first of said first plurality of mixers, means for applying each of the remaining first signals to a respective one of the remaining first plurality of mixers, a first phase discriminator for providing a first direct current signal, a first frequency oscillator, means for connecting the output of the last of said first plurality of mixers to the first phase discriminator, means for coupling the output of said first frequency oscillator to the first phase discriminator, means connected between the output of said first phase discriminator and said first frequency oscillator for substantially eliminating alternating current signals in the output of said first phase discriminator and for controlling the frequency of said first frequency oscillator in dependency on the magnitude of said first direct current signal to provide a selected signal having a desired frequency, divider means connected to the output of said first frequency oscillator for dividing said desired frequency by a predetermined divisor to provide a control signal having a frequency equal to the sum of a fixed value and a variable value, a second plurality of mixers connected in cascade, means connected between said divider means and the first of said second plurality of mixers for applying said control signal to the first of said second plurality of mixers, means for applying each of said second signals to a respective one of said second plurality of mixers, a second phase discriminator for providing a second direct current signal, means for connecting the output of the last of said second plurality of mixers to the second phase discriminator, a second frequency oscillator, means for coupling the output of said second frequency oscillator to said second phase discriminator, means connected between the output of said second phase discriminator and said second frequency oscillator for substantially eliminating alternating current signals in the output of said second phase discriminator and for controlling the frequency of said second frequency oscillator in dependency on the magnitude of said second direct current signal, a mixer, means for connecting said mixer to the output of said second frequency oscillator, means connected to said mixer for applying a signal to the mixer having a frequency equal to the sum of the fixed value of said control signal and the values of the frequencies of said second signals, an output circuit, and means for connecting said output circuit to said mixer.

References Cited in the file of this patent

UNITED STATES PATENTS

| | | |
|---|---|---|
| 2,332,540 | Travis | Oct. 26, 1943 |
| 2,416,078 | Ziegler | Feb. 18, 1947 |
| 2,507,317 | Moore | May 9, 1950 |
| 2,567,286 | Hugenholtz | Sept. 11, 1951 |
| 2,605,425 | Hugenholtz | July 29, 1952 |
| 2,623,177 | Hugenholtz | Dec. 23, 1952 |
| 2,653,315 | Wheeler | Sept. 22, 1953 |
| 2,662,181 | Hugenholtz | Dec. 8, 1953 |
| 2,704,329 | Law | Mar. 15, 1955 |
| 2,719,231 | Hugenholtz | Sept. 27, 1955 |
| 2,777,055 | Goldberg | Jan. 8, 1957 |